United States Patent
Nutwell et al.

(10) Patent No.: US 7,640,146 B2
(45) Date of Patent: Dec. 29, 2009

(54) METHOD AND SYSTEM FOR MODELING SPOT WELDS IN A FINITE ELEMENT ANALYSIS

(75) Inventors: Emily Nutwell, Dublin, OH (US);
Duane Detwiler, Powell, OH (US);
John O. Hallquist, Livermore, CA (US)

(73) Assignees: Livermore Software Technology Corporation, Livermore, CA (US);
Honda Motor Co., Ltd., Tokyo (JP)

( * ) Notice: Subject to any disclaimer, the term of this patent is extended or adjusted under 35 U.S.C. 154(b) by 540 days.

(21) Appl. No.: 11/565,175

(22) Filed: Nov. 30, 2006

(65) Prior Publication Data

US 2007/0295700 A1 Dec. 27, 2007

Related U.S. Application Data

(60) Provisional application No. 60/805,964, filed on Jun. 27, 2006.

(51) Int. Cl.
*G06F 17/50* (2006.01)
*B23K 26/00* (2006.01)
(52) U.S. Cl. .................. 703/2; 228/101; 219/87
(58) Field of Classification Search ........... 703/2, 703/5; 228/101; 219/121.64, 87; 226/101
See application file for complete search history.

(56) References Cited

U.S. PATENT DOCUMENTS

2007/0053168 A1 *  3/2007  Sayir et al. .................. 361/718
2007/0090165 A1 *  4/2007  Kumagai .................... 228/101
2007/0210042 A1 *  9/2007  Forrest et al. .......... 219/121.64

OTHER PUBLICATIONS

Seeger, et al., "An investigation on spot weld modelling for crash simulation with LS-DYNA", Proceedings from 4th LS-Dyna Forum, Oct. 20-21, 2005, pp. B-I-1 to B-I-12, ISBN 3-9809901-1-7, DYNAmore GmbH, Bamberg, Germany.

* cited by examiner

*Primary Examiner*—Thai Phan
(74) *Attorney, Agent, or Firm*—Roger H. Chu

(57) ABSTRACT

A system, method and software product for modeling spot welds in a finite element analysis is described. The spots welds are represented by beam elements or solid elements in accordance with an indicator flag. The flag may also be specified as the number (e.g., an integer such as 1, 4, 8 or 16) of solid elements in a cluster representing spot weld. The solid elements may include, but not limited to, hexahedron, tetrahedron, and the likes. The number of solid elements and required nodes are generated for each spot weld based on the indicator flag. A table is formed to group the generated solid elements in a cluster together, so that the force and moment resultants of the spot weld can be computed and assembled in a file.

21 Claims, 5 Drawing Sheets

METHOD AND SYSTEM FOR MODELING SPOT WELDS IN A FINITE ELEMENT ANALYSIS

BACKGROUND

1. Field of the Invention

The present invention generally relates to a method, system and software product used in computer-aided engineering analysis of a structure, more particularly to modeling spot welds in a finite element analysis.

2. Description of the Related Art

Finite element analysis (FEA) is a computerized method widely used in industry to model and solve engineering problems relating to complex systems such as three-dimensional non-linear structural design and analysis. FEA derives its name from the manner in which the geometry of the object under consideration is specified. With the advent of the modern digital computer, FEA has been implemented as FEA software. Basically, the FEA software is provided with a model of the geometric description and the associated material properties at each point within the model. In this model, the geometry of the system under analysis is represented by solids, shells and beams of various sizes, which are called elements. The vertices of the elements are referred to as nodes. The model is comprised of a finite number of elements, which are assigned a material name to associate with material properties. The model thus represents the physical space occupied by the object under analysis along with its immediate surroundings. The FEA software then refers to a table in which the properties (e.g., stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

FEA is becoming increasingly popular with automobile manufacturers for optimizing both the aerodynamic performance and structural integrity of vehicles. Similarly, aircraft manufacturers rely upon FEA to predict airplane performance long before the first prototype is built. Rational design of semiconductor electronic devices is possible with Finite Element Analysis of the electrodynamics, diffusion, and thermodynamics involved in this situation. FEA is utilized to characterize ocean currents and distribution of contaminants. FEA is being applied increasingly to analysis of the production and performance of such consumer goods as ovens, blenders, lighting facilities and many plastic products. In fact, FEA has been employed in as many diverse fields as can be brought to mind, including plastics mold design, modeling of nuclear reactors, analysis of the spot welding process, microwave antenna design, simulating of car crash and biomedical applications such as the design of prosthetic limbs. In short, FEA is utilized to expedite design, maximize productivity and efficiency, and optimize product performance in virtually every stratum of light and heavy industry. This often occurs long before the first prototype is ever developed.

One of the most challenging FEA tasks is to simulate an impact event such as car crash or metal forming. In a typical car, there are about 4,000-8,000 spot welds connecting 300-600 body parts to form the vehicle structure. For accurate simulation of the vehicle as a whole, those spot welds have to be modeled accurately. Spot welds are typically placed 2-3 centimeters apart, and each spot weld has a diameter between 4 to 9 millimeters. Traditionally, each of the spot welds has been modeled with a very short beam element (e.g., length of 1-2 millimeters) in FEA. As the modern computer improves, the finite element models representing a vehicle have become huge (e.g., more than 1,000,000 elements). Thereby, the size of each element becomes much smaller. Representing spot welds using beam elements are not adequate any more, instead solid elements are used. In certain cases, spot welds have been modeled with more than one solid element. As a result, it is very tedious and time consuming to create a cluster of solid elements to represent a single spot weld, when there are thousands of spot welds in one vehicle.

It is therefore desirable to have new improved method and system for generating solid elements to represent spot welds using the traditional spot weld input definition in a finite element analysis.

SUMMARY

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

The present invention discloses a system, method and software product for. According to one aspect, each of the spot welds is specified in the input file (e.g., a beam element) of an engineering analysis or simulation software module (e.g., a finite element analysis software). To facilitate the software module using solid elements to represent spot welds, an indicator flag is specified in the spot weld input definitions (e.g., the control card in spot weld beam). When the indicator flag has a default value of zero, beam elements are used. Otherwise solid elements are used. According to another aspect, if solid elements are chosen to represent spot welds, the number of solid elements in each cluster is determined. The required nodes and solid elements are generated in accordance with the number of the solid element in each cluster. A cluster of solid elements is then grouped together in a table, so that force and moment resultants can be computed and assembled for each of the spot weld.

According to one embodiment, the present invention is a method for modeling spot welds in a finite element analysis of a structure, the method includes at least the following: receiving an indicator flag; when the flag indicates solid element clusters to represent the spot welds, determining number of solid elements in each of the clusters; generating solid elements and required nodes in accordance with the number in said each of the clusters; and grouping the generated solid elements together for said each of the clusters; and when the flag indicates beam elements to model the spot welds, creating a beam element definition representing each of the spot welds.

One of objects, features, and advantages of the present invention is to use solid elements to represent spot welds without major modifications to the traditionally used beam element definitions in a finite element analysis.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

DESCRIPTION

Figure 1A:
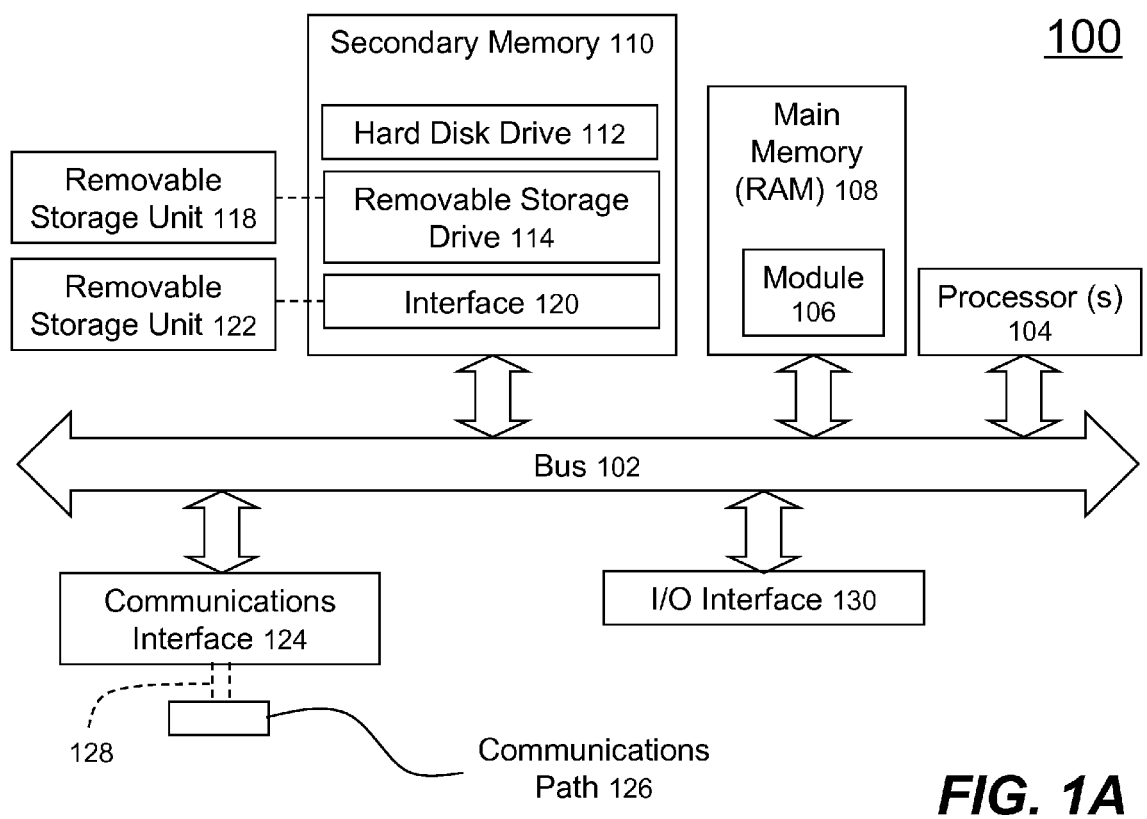
FIG. 1A depicts a block diagram of an exemplary computer, in which one embodiment of the present invention may be implemented.

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

To facilitate the description of the present invention, it deems necessary to provide definitions for some terms that will be used throughout the disclosure herein. It should be noted that the definitions following are to facilitate the understanding and describe the present invention according to an embodiment. The definitions may appear to include some limitations with respect to the embodiment, the actual meaning of the terms has applicability well beyond such embodiment, which can be appreciated by those skilled in the art:

FEA stands for Finite Element Analysis.

Implicit FEA refers to K u=F, where K is the effective stiffness matrix, u is the unknown displacement array and F is the effective loads array. F is a right hand side loads array while K is a left hand side stiffness matrix. The solution is performed at the global level with a factorization of the effective stiffness matrix, which is function of the stiffness, mass and damping. One exemplary solution method is the Newmark integration scheme.

Explicit FEA refers to M a=F, where M is the diagonal mass array, a is the unknown nodal acceleration array and F is the effective loads array. The solution can be carried out at element level without factorization of a matrix. One exemplary solution method is called the central difference method.

Beam element refers to a one-dimensional finite element defined by two nodes.

Solid element refers to a three-dimensional finite element with volume. Typical solid elements may include, but not be limited to, tetrahedron, hexahedron, and the likes.

Embodiments of the present invention are discussed herein with reference to FIGS. 1A-5. However, those skilled in the art will readily appreciate that the detailed description given herein with respect to these figures is for explanatory purposes as the invention extends beyond these limited embodiments.

Referring now to the drawings, in which like numerals refer to like parts throughout several views. The present invention may be implemented using hardware, software or a combination thereof and may be implemented in a computer system or other processing system. In fact, in one embodiment, the invention is directed towards one or more computer systems capable of carrying out the functionality described herein. An example of a computer system 100 is shown in FIG. 1A. The computer system 100 includes one or more processors, such as processor 122. The processor 122 is connected to a computer system internal communication bus 120. Various software embodiments are described in terms of this exemplary computer system. After reading this description, it will become apparent to a person skilled in the relevant art(s) how to implement the invention using other computer systems and/or computer architectures.

Computer system 100 also includes a main memory 108, preferably random access memory (RAM), and may also include a secondary memory 110. The secondary memory 110 may include, for example, one or more hard disk drives 112 and/or one or more removable storage drives 114, representing a floppy disk drive, a magnetic tape drive, an optical disk drive, etc. The removable storage drive 114 reads from and/or writes to a removable storage unit 118 in a well-known manner. Removable storage unit 118, represents a floppy disk, magnetic tape, optical disk, etc. which is read by and written to by removable storage drive 114. As will be appreciated, the removable storage unit 118 includes a computer usable storage medium having stored therein computer software and/or data.

In alternative embodiments, secondary memory 110 may include other similar means for allowing computer programs or other instructions to be loaded into computer system 100. Such means may include, for example, a removable storage unit 122 and an interface 120. Examples of such may include a program cartridge and cartridge interface (such as that found in video game devices), a removable memory chip (such as an EPROM, or PROM) and associated socket, and other removable storage units 122 and interfaces 120 which allow software and data to be transferred from the removable storage unit 122 to computer system 100. In general, Computer system 100 is controlled and coordinated by operating system (OS) software, which performs tasks such as process scheduling, memory management, networking and I/O services. Exemplary OS includes Linux®, Microsoft Windows®.

There may also be a communications interface 124 connecting to the bus 102. Communications interface 124 allows software and data to be transferred between computer system 100 and external devices. Examples of communications interface 124 may include a modem, a network interface (such as an Ethernet card), a communications port, a PCMCIA slot and card, etc. Software and data transferred via communications interface 124 are in the form of signals 128 which may be electronic, electromagnetic, optical, or other signals capable of being received by communications interface 124. These signals 128 are provided to communications interface 124 via a communications path (i.e., channel) 126. This channel 126 carries signals (or data flows) 128 and may be implemented using wire or cable, fiber optics, a phone line, a cellular phone link, an RF link and other communications channels.

The channel 126 facilitates a data flow 128 between a data network and the computer 100 and typically executes a special set of rules (i.e., a protocol) to send data back and forth. One of the common protocols is TCP/IP (Transmission Control Protocol/Internet Protocol) commonly used in the Internet. In general, the communication interface 124 manages the assembling of a data file into smaller packets that are transmitted over the data network or reassembles received packets into the original data file. In addition, the communication interface 124 handles the address part of each packet so that it gets to the right destination or intercepts packets destined for the computer 100.

In this document, the terms "computer program medium" and "computer usable medium" are used to generally refer to media such as removable storage drive 114, a hard disk installed in hard disk drive 112, and signals 128. These computer program products are means for providing software to computer system 100. The invention is directed to such computer program products.

The computer system 100 may also include an I/O interface 130, which provides the computer system 100 to access monitor, keyboard, mouse, printer, scanner, plotter, and alike.

Computer programs (also called computer control logic) are stored as application modules 106 in main memory 108 and/or secondary memory 110. Computer programs may also be received via communications interface 124. Such computer programs, when executed, enable the computer system 100 to perform the features of the present invention as discussed herein. In particular, the computer programs, when executed, enable the processor 104 to perform features of the present invention. Accordingly, such computer programs represent controllers of the computer system 100.

In an embodiment where the invention is implemented using software, the software may be stored in a computer program product and loaded into computer system 100 using removable storage drive 114, hard drive 112, or communications interface 124. The application module 106, when executed by the processor 104, causes the processor 104 to perform the functions of the invention as described herein.

The main memory 108 may be loaded with one or more application modules 106 that can be executed by one or more processors 104 with or without a user input through the I/O interface 130 to achieve desired tasks. In operation, when at least one processor 104 executes one of the application modules 106, the results are computed and stored in the secondary memory 110 (i.e., hard disk drive 112). The status of the finite element model definition (e.g., the spot weld definitions) is reported to the user via the I/O interface 130 either as a list or a graph.

In one embodiment, an application module 106 is configured to facilitate generation of solid elements representing spot welds. As an indication flag is detected, the application module 106 replaces the beam definition with one or more solid elements. In another embodiment, a plurality of solid elements is grouped together as a cluster to represent one spot weld.

Figure 1B:
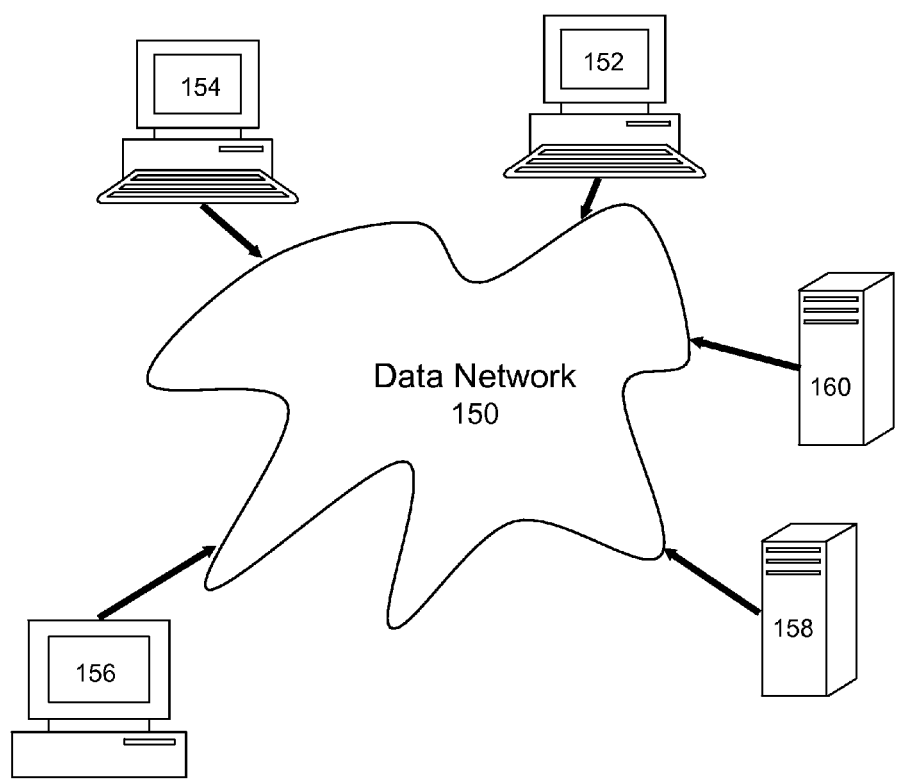
FIG. 1B depicts an exemplary network environment that one embodiment of the present invention may be deployed.

FIG. 1B depicts a networked computing environment 140, in which one embodiment of the present invention may be practiced. A plurality of network capable computing devices 152, 154, 156, 158 and 160 (e.g., the computer device 100 described in FIG. 1A) are coupled to a data network 150. These computing devices 152-160 can communicate with each other via the network 150. The data network 150 may include, but is not limited to, the Internet, an Intranet, local area network (LAN), wide area network (WAN), a wireless network or a data network comprises of public and private networks. In one embodiment, the application module (i.e., 106 in FIG. 1A) for an engineering analysis (e.g., finite element analysis) is configured and executed on a computing device 156. The user prepares the input file using a preprocessing software module also located on the device 156. And the analysis is performed and the output of the analysis is fed to a post-processing module to present the results either in numerical or graphical form. In another embodiment, the application module for an engineering analysis is configured and executed on the computing device 160. A user may prepare an input file describing physical structure (e.g., a vehicle, spot welds, etc.) on a personal workstation computing device 152. The input file is then sent to the computing device 160 via the network 150 to facilitate the computation of the engineering analysis. During the execution of the application module, the user may be able to monitor the progress of the analysis at another computing device 156. Finally after the analysis is completed, the user may examine the computed results by retrieving the stored result file from the computer 160 to any one of the computing devices 152, 154 or 156 for a post-processing, which in general includes a graphical representation of the analysis results. One exemplary implementation of this technique is included in a suite of engineering analysis computer software products, LS-PREPOST® and LS-DYNA®, offered by Livermore Software Technology Corporation, Livermore, Calif., USA.

Figure 2:
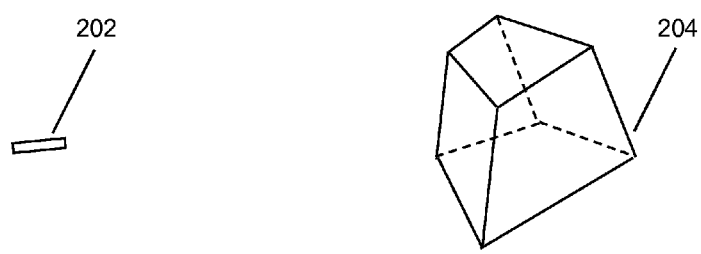
FIG. 2 shows an exemplary beam and an exemplary solid element in accordance with one embodiment of the present invention.

FIG. 2 shows an exemplary beam and an exemplary solid element in accordance with one embodiment of the present invention. The Beam element 202 is a one-dimensional element defined by two nodes. Traditionally a very short (e.g., 1-2 mm length) beam element is used to model a spot weld connecting two metal parts in a structure (e.g., a vehicle). More recently, a spot weld may be modeled with one or more solid elements (e.g., hexahedron 204) in a cluster. The solid elements representing the same spot weld are grouped together, so that the resultant force and moment of the cluster (i.e., the spot weld) can be reported.

Figure 3:
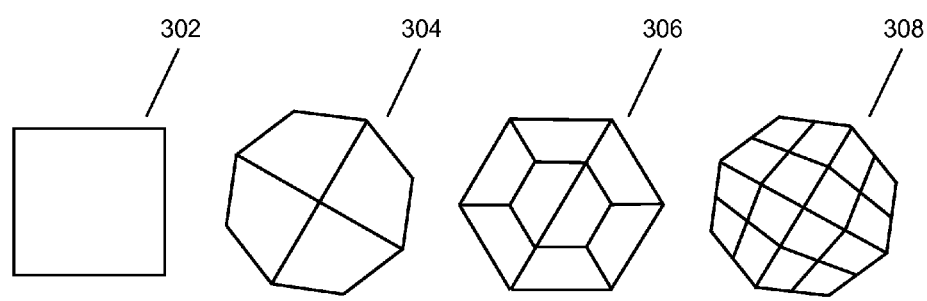
FIG. 3 shows several exemplary solid element clusters in accordance with one embodiment of the present invention.

FIG. 3 shows several exemplary solid element clusters in accordance with one embodiment of the present invention. Spot welds can be represented by one or more solid elements in a cluster. Exemplary hexahedron element clusters 302, 304, 306, and 308 depicted in FIG. 3 are for 1-, 4-, 8- and 16-elements, respectively. Although only four exemplary clusters are shown, the present invention does not limit these four types. Other arrangements will be appreciated by those skilled in the art. Similarly, other types of the solid elements such as tetrahedron can be implemented in the present invention.

Figure 4:
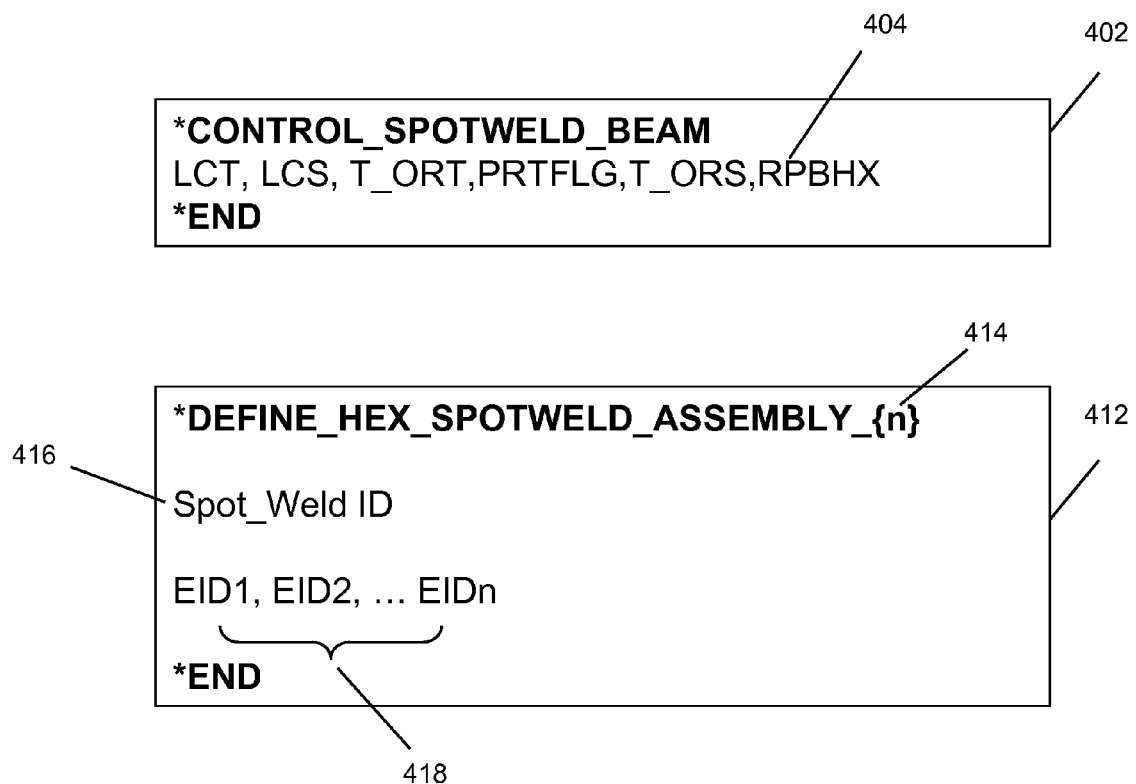
FIG. 4 shows an exemplary spot weld definition used in a finite element analysis software module in accordance with one embodiment of the present invention.

FIG. 4 shows an exemplary spot weld definition used in a finite element analysis software module. In accordance with one embodiment of the present invention, an indicator flag (e.g., RPBHX 404) of a control card 402 for spot weld is used for determining whether beam or solid elements to be used in the finite element analysis. For example, the indicator flag 404 may have a default value of zero, which causes the software module to use beam elements. Any other values would cause the software module to use solid elements to represent spot welds. The flag may also be used for providing other information such as the number of solid elements to represent each spot weld. In one embodiment, the possible values for the indicator flag are 1, 4, 8 or 16 for the number of hexahedral elements. In another embodiment, other values may be used for different solid elements (e.g., tetrahedron). Based on the indicator flag 404, the software module is able to generate required nodes and solid elements to represent each of the spot welds defined. In order to associate the generated solid elements together to represent one spot weld, the software module groups or assembles a cluster of solid elements representing a single spot weld together in table definition, for example DEFINE_HEX_SPOTWELD_ASSEMBLY_{n} 412. In this embodiment, the user specifies the number {n} 414 of solid elements representing each of the spot welds. An identity of the spot weld 416 can be specified. A set of n solid elements 418 is listed to group them together as one cluster to represent the spot weld. It is evident that the model creation of spot welds with solid elements is very tedious. With automated generation of solid elements based on the indicator flag 404, the present invention enables the generation of definition 412.

Figure 5:
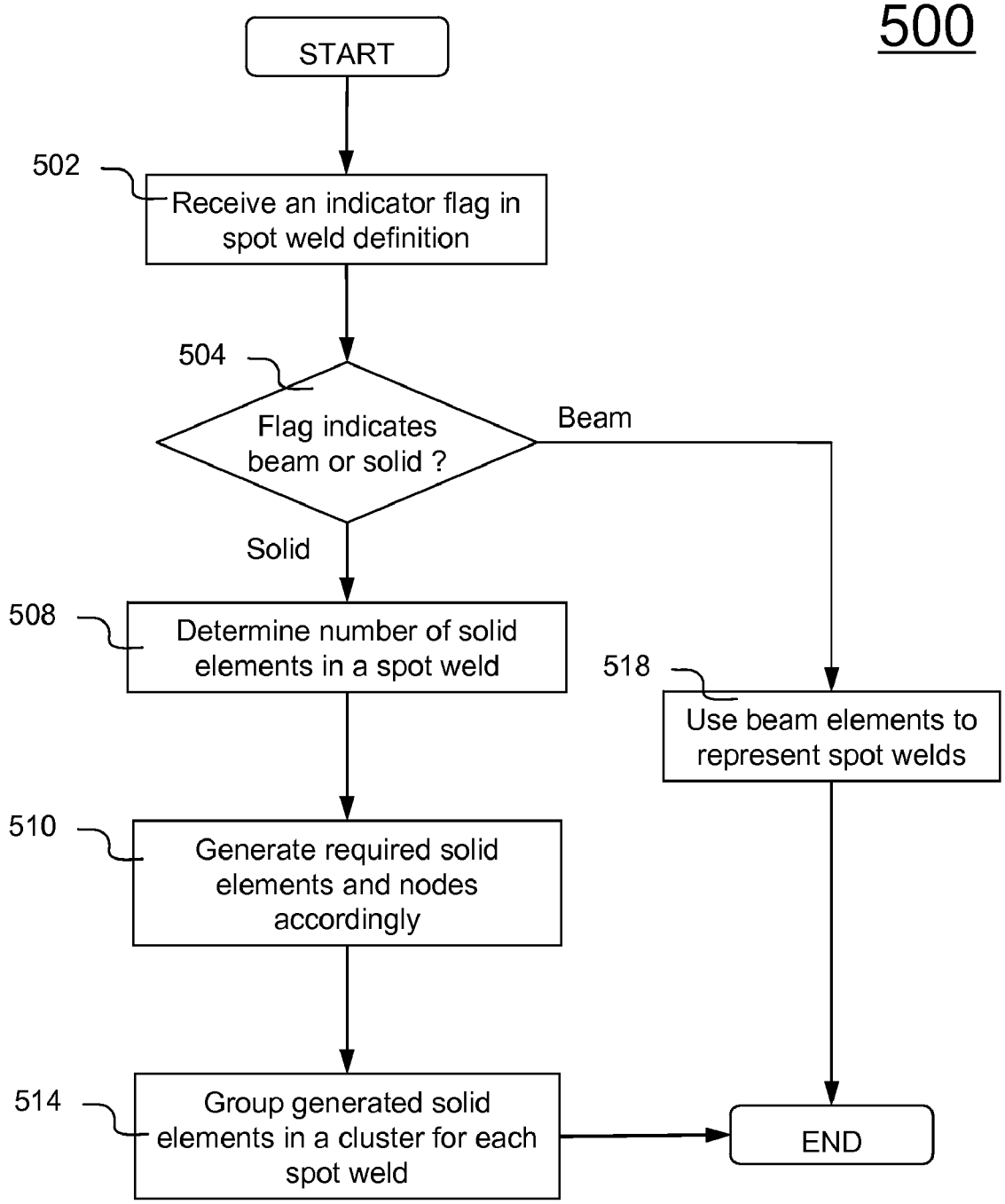
FIG. 5 shows a flowchart or process of modeling spot welds in accordance with one embodiment of the present invention.

FIG. 5 shows a flowchart or process 500 of modeling spot welds in a finite element analysis in accordance with one embodiment of the present invention. The process 500 is preferably understood in conjunction with the previous figures especially FIGS. 3 and 4. The process 500 starts by receiving an indication flag in a spot weld definition (e.g. a definition for beam element in FIG. 4) at 502. The process 500 then moves to a test 504, in which the flag is examined to determine whether beam or solid elements are used to represent spot welds. When the flag indicates beam elements, the process 500 follows the "Beam" branch to 518. The beam element is used to represent spot weld. The process 500 ends. Otherwise, the flag indicates solid elements at the test 504. The process 500 follows the "Solid" branch to 508, in which the number of solid elements for each of the spot welds is determined. In one embodiment, the flag is specified as the number of the solid elements (e.g., an integer such as 1, 4, 8 or 16). It is noted that there may be different number of solid elements representing two different spot welds. Based on the number of solid elements determined in 508, the process 500 generates the number of solid elements and nodes required to represent the spot weld at 510. Finally, the process 500 groups the generated solid elements in a table at 514 before ending. This is to ensure that the force and moment resultants of the spot weld can be properly computed and assembled based on the information in the table in a file. For example, a file named "swforc' in LS-DYNA is created to store the force and moment resultants of spot welds.

Although an exemplary embodiment of invention has been disclosed, it will be apparent to those skilled in the art that various changes and modifications may be made to achieve the advantage of the invention. It will be obvious to those skilled in the art that some components may be substituted with another component providing same function. The appended claims cover the present invention.

What is claimed is:

1. A method for modeling spot welds in a finite element analysis of a structure, the method comprising:
   receiving an indicator flag;
   when the flag indicates solid element clusters to represent the spot welds,
      determining number of solid elements in each of the clusters;
      generating solid elements and required nodes in accordance with the number in said each of the clusters; and
      grouping the generated solid elements together for said each of the clusters.

2. The method of claim 1, further comprising creating a beam element definition representing each of the spot welds, when the flag indicates beam elements to model the spot welds.

3. The method of claim 1, wherein the flag is specified in a definition of a beam element representing said each of the spot welds.

4. The method of claim 3, wherein the generated solid elements are hexahedron elements or tetrahedron elements.

5. The method of claim 3, wherein the number of solid elements in said each of the clusters is an integer such as 1, 4, 8 or 16.

6. The method of claim 3, wherein the number of solid elements in said each of the clusters is specified in the flag.

7. The method of claim 3, wherein the required nodes are nodes for the generation solid elements.

8. The method of claim 3, said generating further comprising:
   creating nodal coordinates for each of the required nodes;
   creating solid element definition for each of the generated solid elements; and
   replacing the beam element with the generated solid elements for said each of the clusters.

9. The method of claim 8, wherein the solid element definition includes node identities.

10. The method of claim 3, said grouping further comprising forming a table for said each of the clusters when the number of solid elements in said each of the clusters is greater than 1.

11. The method of claim 10, wherein the table includes element identities of all of the generated solid elements in said each of the clusters.

12. The method of claim 11, wherein the table is used as directive for assembling force and moment resultants of said each of the clusters.

13. The method of claim 12, wherein each of the force and moment resultants is labeled with identity of the beam element for said each of the clusters and saved to a file.

14. A computer program product including a computer usable medium having computer readable code embodied in the medium for causing an application module to execute on a computer for modeling spot welds in a finite element analysis of a structure, the computer program product comprising:
   computer readable code for receiving an indicator flag;
   when the flag indicates solid element clusters to represent the spot welds,
      computer readable code for determining number of solid elements in each of the clusters;
      computer readable code for generating solid elements and required nodes in accordance with the number in said each of the clusters; and
      computer readable code for grouping the generated solid elements together for said each of the clusters.

15. The computer program product of claim 14, further comprising computer readable code for creating a beam element definition representing each of the spot welds, when the flag indicates beam elements to model the spot welds.

16. The computer program product of claim 14, said computer readable code for generating further comprising:
   computer readable code for creating nodal coordinates for each of the required nodes;
   computer readable code for creating solid element definition for each of the generated solid elements; and
   computer readable code for replacing the beam element with the generated solid elements for said each of the clusters.

17. The computer program product of claim 14, said computer readable code for grouping further comprising computer readable code for forming a table for said each of the clusters when the number of solid elements in said each of the clusters is greater than 1.

18. A system for modeling spot welds in a finite element analysis of a structure, the system comprising:

an I/O interface;

a communication interface;

a secondary memory;

a main memory for storing computer readable code for an application module;

at least one processor coupled to the main memory, the secondary memory, the I/O interface, and the communication interface, said at least one processor executing the computer readable code in the main memory to cause the application module to perform operations of:

receiving an indicator flag;

when the flag indicates solid element clusters to represent the spot welds, determining number of solid elements in each of the clusters;

generating solid elements and required nodes in accordance with the number in said each of the clusters; and grouping the generated solid elements together for said each of the clusters.

19. The system of claim 18, further comprising operations of creating a beam element definition representing each of the spot welds, when the flag indicates beam elements to model the spot welds.

20. The system of claim 18, said generating further comprising operations of:

creating nodal coordinates for each of the required nodes;

creating solid element definition for each of the generated solid elements; and replacing the beam element with the generated solid elements for said each of the clusters.

21. The system of claim 18, said grouping further comprising operations of forming a table for said each of the clusters when the number of solid elements in said each of the clusters is greater than 1.

* * * * *